United States Patent [19]
Taki et al.

[11] Patent Number: 5,144,199
[45] Date of Patent: Sep. 1, 1992

[54] MICROWAVE DISCHARGE LIGHT SOURCE DEVICE

[75] Inventors: Masakazu Taki; Kenji Yoshizawa; Junichi Nishimae, all of Amagasaki, Japan

[73] Assignee: Mitsubishi Denki Kabushiki Kaisha, Tokyo, Japan

[21] Appl. No.: 637,636

[22] Filed: Jan. 4, 1991

[30] Foreign Application Priority Data

Jan. 11, 1990 [JP] Japan .................................. 2-4762
Jun. 26, 1990 [JP] Japan ................................ 2-170916

[51] Int. Cl.⁵ .............................................. H01J 7/26
[52] U.S. Cl. .................................... 313/484; 313/44; 313/634; 313/160; 315/39; 315/248
[58] Field of Search ................... 313/44, 39, 634, 160, 313/161; 315/39, 248, 111.01

[56] References Cited

U.S. PATENT DOCUMENTS 4,504,768  3/1975   Ury et al. ......................... 315/39 X
4,975,625  12/1990  Lynch et al. ..................... 315/39 X
5,008,593  4/1991   Schlie et al. ........................ 315/39

FOREIGN PATENT DOCUMENTS 0036923  2/1986  Japan .
0063262  3/1989  Japan .

Primary Examiner—Donald J. Yusko
Assistant Examiner—Ashok Patel
Attorney, Agent, or Firm—Oblon, Spivak, McClelland, Maier & Neustadt

[57]  ABSTRACT

A microwave discharge light source device in which one side of a discharge space in which a plasma emission takes place is defined by a transparent dielectric member. A transparent microwave reflecting member is disposed in a position such as to face the discharge space through the dielectric member. A microwave having an electric field component in the direction of thickness of the dielectric member is introduced into the dielectric member through the coupling at an end surface of the dielectric member so that a microwave electric field is formed in the discharge space, and so that the plasma emission medium emits light by electric discharge. The light thus emitted is extracted through the transparent microwave reflecting member.

19 Claims, 7 Drawing Sheets

MICROWAVE DISCHARGE LIGHT SOURCE DEVICE

BACKGROUND OF THE INVENTION

1. Field of the Invention

This invention relates to a microwave discharge light source device and, more particularly, to a microwave discharge light source device for producing vacuum ultraviolet light used for a photo-excitation process such as photo CVD.

2. Description of the Related Art

FIG. 8 is a schematic cross-sectional view of a photo-excitation processing apparatus to which a conventional microwave discharge light source device is applied, which is disclosed in Japanese Patent Laid-Open No. 61-36923. The apparatus shown in FIG. 8 has a reaction chamber 1 in which a rotatable substrate holder 2 is disposed and in which a substrate 3 to be processed is mounted on the substrate holder 2. A reactant gas inlet port 4 and an exhaust port 5 connected to a vacuum pump (not shown) are provided on walls of the reaction chamber 1. A discharge tube 6 extends from the outside of the reaction chamber 1 toward the substrate 3 through a wall of the reaction chamber 1. A discharge gas supply unit 8 having a transmission window 7 is provided at one end 6a of the discharge tube 6. The discharge gas supply unit 8 is connected to an outer peripheral portion of the discharge tube 6 in a vacuum-tight manner and has a discharge gas inlet 9. The other end 6b of the discharge tube 6 is connected to a vacuum pump (not shown) and has a microwave cavity 10.

The operation of this apparatus is as described below. Discharge gas enters the discharge gas supply unit 8 through the discharge gas inlet 9, and then the gas is introduced into the discharge tube 6 by flowing along the end 6a of the discharge tube 6 through the gap on the transmission window 7 and is discharged through the other end 6b. Microwave discharge is effected by supplying microwaves of electric power to the microwave cavity 10 so that ultraviolet light is produced in the discharge tube 6. The ultraviolet light thereby produced passes through the transmission window 7 to irradiate the whole surface of the substrate 3 on the substrate holder 2 disposed in the reaction chamber 1. Photochemical reaction in a reactant gas which has been introduced into the reaction chamber 1 through the reactant gas inlet port 4 is caused by the ultraviolet light, thus effecting a photo-excitation processing such as photo CVD or photo-etching on the substrate 3.

The conventional microwave discharge light source device is thus constructed. The substrate is therefore irradiated with only part of the ultraviolet light emitted in the direction of the transmission window 7, although the ultraviolet light produced in the discharge tube 6 is emitted in all directions. The rest of the ultraviolet light emitted in the other directions is unavailable because it is entirely absorbed by the discharge tube wall without being transmitted. That is, only a restricted part of the ultraviolet light produced in the discharge tube 6 is utilized by being extracted out of the discharge tube, and the efficiency of the light source device is therefore very low. In addition, because of a specific property of microwaves such that discharge is locally effected in the vicinity of the tube wall, the uniformity of emission of light is impaired if the tube diameter is increased. It is therefore difficult to uniformly irradiate a large-area substrate 3. It is also difficult to increase the discharged power in order to raise the luminance, because the discharge tube and the transmission window cannot be cooled sufficiently.

Summary of the Invention

In view of these problems, an object of the present invention is to provide a high-efficiency microwave discharge light source device capable of uniformly irradiating a surface having a large area, capable of increasing the discharged power density and capable of entirely extracting the light produced in the discharge tube.

According to the present invention, there is provided a microwave discharge light source device wherein one side of a discharge space in which a plasma emission medium is defined by a transparent dielectric member; a transparent microwave reflecting member is disposed in a position such as to face the discharge space through the dielectric member; a microwave having an electric field component in the direction of thickness of the dielectric member is introduced into the dielectric member through the coupling at an end surface of the dielectric member so that a microwave electric field is formed in the discharge space, and that the plasma emission medium emits light by electric discharge; the light thus emitted is extracted through the transparent microwave reflecting member.

The microwave having an electric field component in the direction of thickness of the dielectric member is transmitted into the dielectric member from the end thereof through the coupling at an improved efficiency, so that a strong microwave electric field is formed in the dielectric member, and that coupling of the microwave to the discharge space is gradually effected.

DESCRIPTION OF THE PREFERRED EMBODIMENTS

Figure 1:
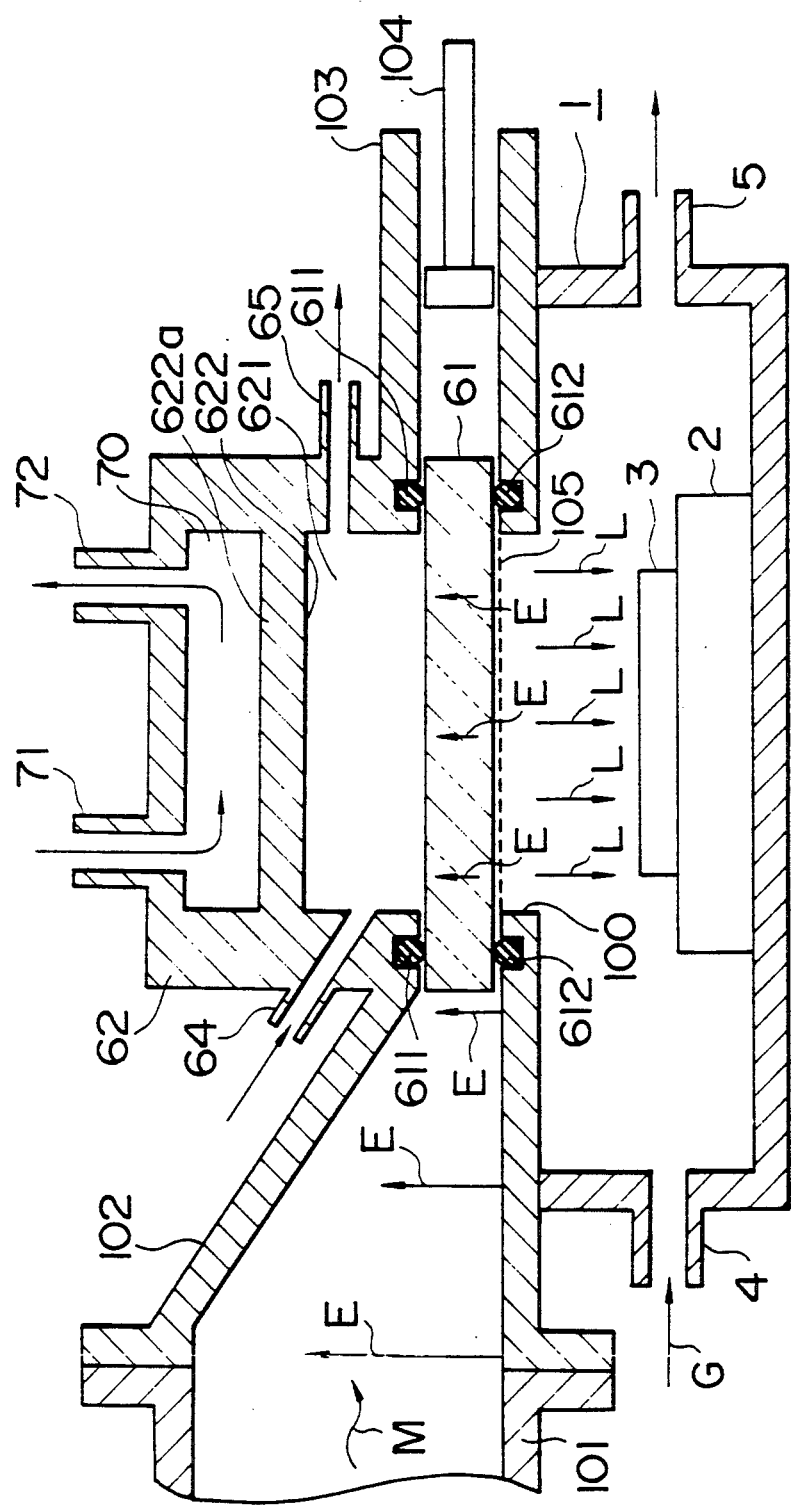
FIG. 1 is a schematic cross-sectional view of a photo-excitation processing apparatus to which a microwave discharge light source device in accordance with an embodiment of the present invention is applied.
Figure 2:
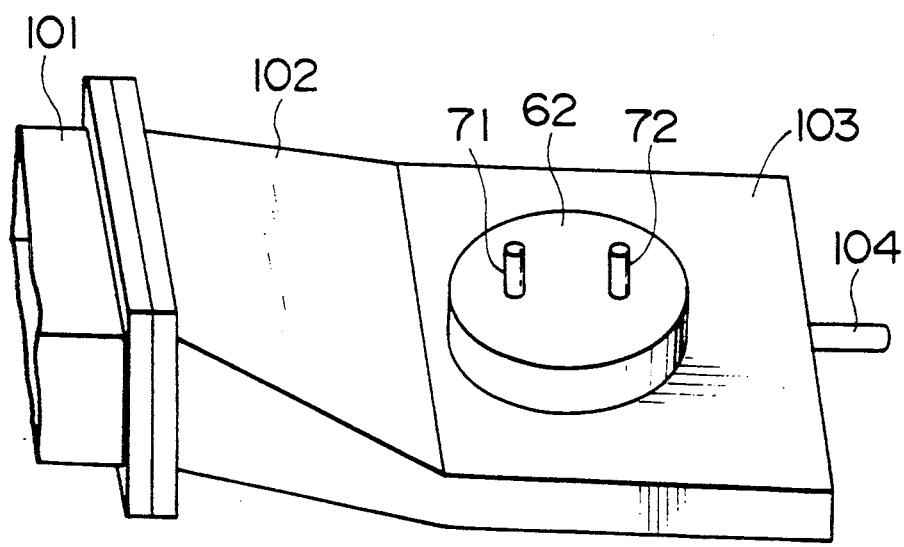
FIG. 2 is a schematic perspective view of the photo-excitation processing apparatus shown in FIG. 1.

Embodiments of the present invention will be described below with reference to the accompanying drawings. FIG. 1 schematically shows in section a photo-excitation processing apparatus to which a light source device in accordance with a first embodiment of the present invention is applied, and FIG. 2 shows a schematic perspective view of the apparatus shown in FIG. 1.

The light source device shown in FIG. 1 has a rectangular waveguide 101, a tapered waveguide 102 having one of its E-plane tapered, a thin waveguide 103, a member 104 movable at an end of the thin waveguide 103, a light transmission window 61 and a circular discharge chamber 62. The light transmission window 61 is a plate which is formed of a dielectric such as sapphire and which is provided in the thin waveguide 103. The thickness of the transmission window 61 is substantially equal to the internal thickness of the thin waveguide 103. The discharge chamber 62 is provided on one side of the thin waveguide 103. The discharge chamber 62 includes an inner discharge space 621 and a cooling bath 70. The discharge space 621 is closed at its one side in a vacuum-tight manner by the light transmission window 61 and an O ring 611. The discharge chamber 62 also has a discharge gas inlet 64, a discharge gas outlet 65, a cooling liquid supply inlet 71, and a cooling liquid discharge outlet 72. A flat metallic meshwork 105 serving as light-transmitting microwave-reflecting means is provided at one side of the thin waveguide 103 remote from the discharge chamber 62 and is capable of reflecting microwaves while transmitting light, and an O ring 612 is provided to separate the reaction chamber 1 and the interior of the waveguides in a vacuum-tight manner. An irradiation opening 100 is formed below the discharge chamber 62 to introduce irradiation light into the reaction chamber 1. Arrows E indicate the electric field in the widthwise direction of the dielectric member, an arrow M indicates the direction in which microwaves propagate, arrows L indicate the direction of the light, and arrows G indicate the directions in which the reactant gas is introduced and discharged.

The operation of this device will be described below. The electric field (indicated by the arrow E) of a microwave M transmitted through the rectangular waveguide 101 is gradually intensified by the tapered waveguide 102, and the microwave is then transmitted into the transmission window 61, i.e., the dielectric plate formed of sapphire or the like through the coupling at the end of the same. Thus, the direction of the electric field in the waveguide is parallel to the direction of thickness of the dielectric plate, microwave coupling to the dielectric plate can therefore be easily effected, and the coupling efficiency is high. During transmission in the light transmission window 61, microwave coupling to the discharge space 621 is gradually effected, the discharge gas in the discharge space 621 emits ultraviolet light to the reaction chamber 1 by electric discharge, and the substrate in the reaction chamber 1 is irradiated with this ultraviolet light. The microwave coupling to the discharge space 621 is effected while the microwave is being transmitted through the dielectric member constituting the light transmission window 61 located at one side of the discharge space 621. It is therefore easy to make the microwave coupling to the discharge space 621 uniform. Also, the electric field strength is large, the size of the discharge space 621 is restricted by the walls of the discharge chamber, and the heat produced by the discharge is removed by the cooling bath 70, thereby increasing the discharge power density and, hence, the luminance of light thereby produced to be easily increased. Further, the area occupied by the light transmission window 61 is large relative to the surfaces surrounding the discharge space 621, and the proportion of the amount of light emitted to the interior of the reaction chamber 1 in the amount of light produced in the discharge chamber 621 can therefore be increased. If a surface 622 of a partition plate 622a facing the light transmission window 61 through the discharge space 621 is formed as a light reflecting surface, the amount of light emitted to the reaction chamber 1 can be further increased.

In the above-described embodiment, the tapered waveguide 102 is used to reduce the waveguide width between the E-plate. Alternatively, a stepped waveguide 106 such as that shown in FIG. 3 may be used in accordance with a second embodiment of the present invention.

In the above-described embodiment, a material including sapphire is used to form the light transmission window member 61. Alternatively, a transparent material such as synthetic quartz or magnesium fluoride (MgF) may be used.

Figure 4:
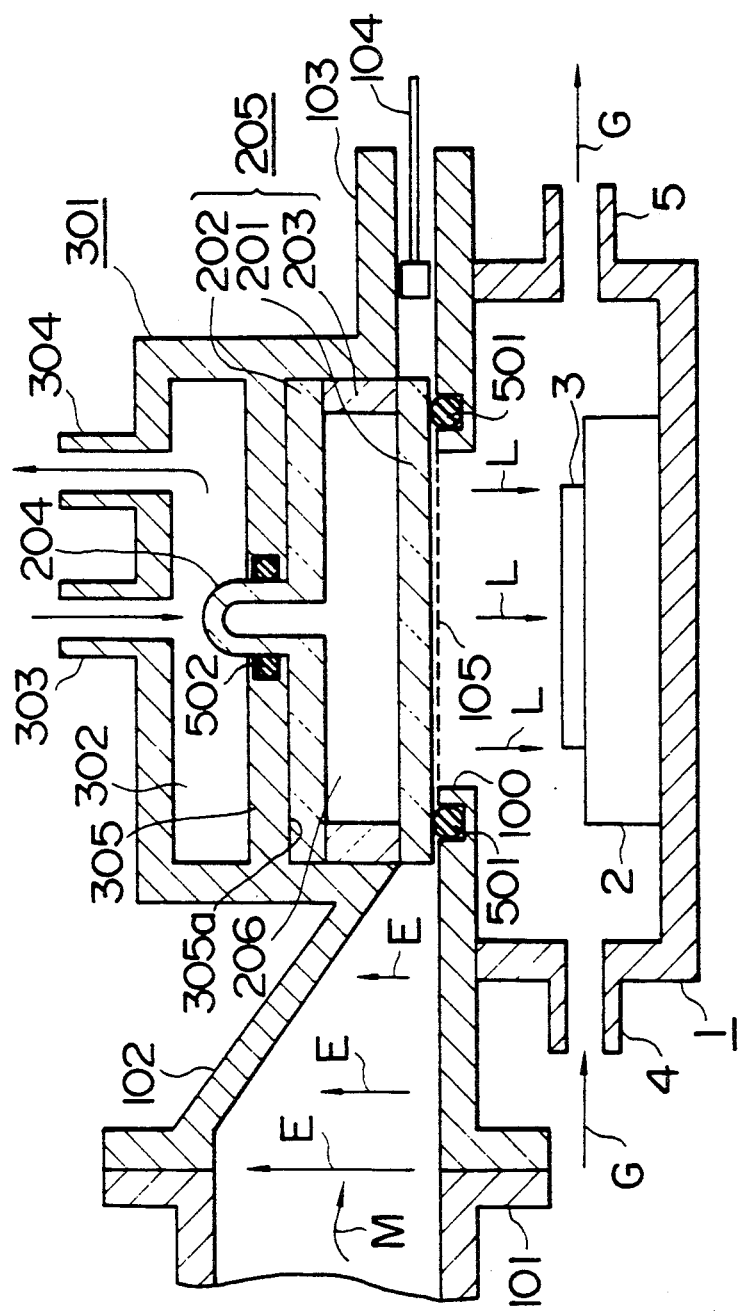
FIG. 4 is a schematic cross-sectional view of a photo-excitation processing apparatus to which a microwave discharge light source device in accordance with a third embodiment of the present invention is applied.

FIG. 4 shows in section a microwave discharge light source device in accordance with a third embodiment of the present invention. The device shown in FIG. 4 has a dielectric plate 201 having a thickness substantially equal to that of the thin waveguide 103 and formed of a synthetic quartz glass capable of transmitting vacuum ultraviolet light, an opposed dielectric member 202 disposed opposite to the dielectric plate 201, side dielectric plate 203, and a planar emission lamp 205 composed of the dielectric plate 201, the opposed dielectric member 202 and the side dielectric plate 203. Each of the dielectric side plate 203 and the opposed dielectric member 202 is formed of a synthetic quartz glass or quartz glass. The planar emission lamp 205 is formed by connecting these members by fusion bonding or flint glass sealing. A discharge space 206 is provided by evacuating the interior of the planer emission lamp 205 and enclosing a plasma light emission medium containing mercury and rare gas, e.g., Ar gas therein. Mercury emission light is produced by electric discharge in the discharge chamber 206. A mercury reservoir 204 is formed by deforming a portion of the opposed dielectric member 202. A circular discharge chamber 301 is provided on one side of the thin waveguide 103. The discharge chamber 301 includes the planar emission lamp 205 and a cooling bath 302. A cooling liquid supply port 303 is formed so as to face the mercury reservoir 204. A metallic partition plate 305 having an inner surface 305a is formed in the discharge chamber 301. An O ring 502 is provided on the partition plate 305 for sealing against the cooling liquid. The discharge chamber 301 also has a cooling liquid outlet 304. A light-transmitting microwave-reflecting member 105 capable of reflecting microwaves and while transmitting light, i.e., a flat metallic meshwork in this case, is provided at one side of the thin waveguide 103 remote from the discharge chamber 301. An O ring 501 is provided to separate the reaction chamber 1 and the interior of the waveguides in a vacuum-tight manner. An irradiation opening 100 is formed below the discharge chamber 301.

The operation of this device will be described below. As in the case of the first and second embodiments, the electric field (indicated by the arrow E) of a microwave transmitted through the rectangular waveguide 101 is gradually intensified by the tapered waveguide 102, and the microwave is then transmitted into the dielectric plate 201 through the coupling at the end of the same. Thus, the direction of the electric field in the waveguide is parallel to the direction of thickness of the dielectric plate, microwave coupling to the dielectric plate can therefore be easily effected, and the coupling efficiency is high. During transmission in the dielectric plate, microwave coupling to the discharge space 206 is gradually effected, the plasma emission medium in the discharge space 206 emits, by electric discharge, ultraviolet light having main mercury wavelengths of 185 nm and 254 nm to the reaction chamber 1 through the irradiation opening 100, and the substrate in the reaction chamber 1 is irradiated with this ultraviolet light. The microwave coupling to the discharge space 206 is effected while the microwave is being transmitted through the dielectric plate 201. It is therefore easy to make the microwave coupling to the discharge space 206 uniform. As a result, electric discharge emission in the discharge space 206 is made uniform so that the target is uniformly irradiated with the ultraviolet light. The vapor pressure of mercury can be controlled by suitably setting the temperature of the cooling bath 302 and controlling the temperature of the mercury reservoir 204. It is thereby possible to emit ultraviolet light at an improved efficiency while increasing the discharge power density. Further, the area occupied by the dielectric plate 201 constituting the light transmission window is large relative to the surfaces surrounding the discharge space 206, and the proportion of the amount of light emitted to the interior of the reaction chamber 1 and the amount of light produced in the discharge chamber 206 can therefore be increased. If the surface 305a of the partition plate 305 adjacent to the opposed dielectric member 202 is formed as a light reflecting surface, the amount of light emitted to the reaction chamber 1 can be further increased.

Figure 5:
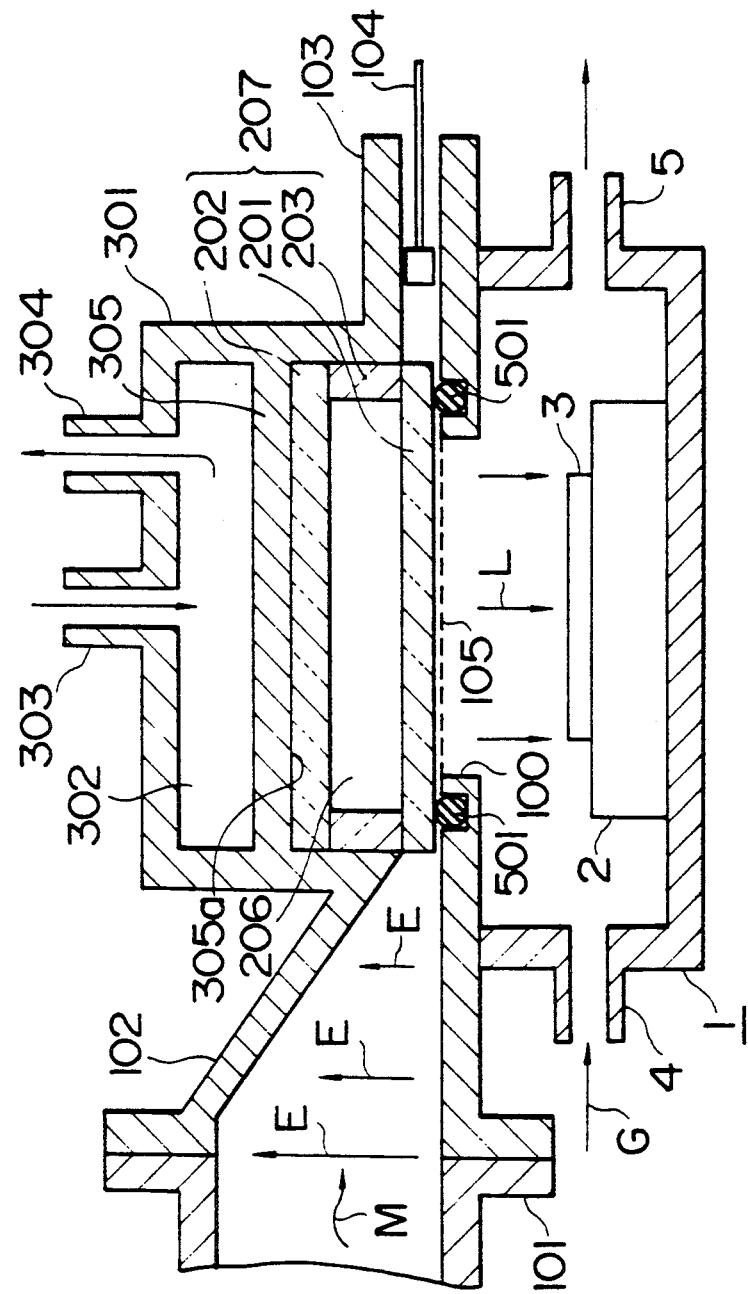
FIG. 5 is a schematic cross-sectional view of a photo-excitation processing apparatus to which a microwave discharge light source device in accordance with a fourth embodiment of the present invention is applied.

In the third embodiment, a projection is provided on the opposed dielectric member 202 to form the mercury reservoir 204 in order to control the vapor pressure of mercury. However, in accordance with a fourth embodiment of the present invention shown in FIG. 5, the discharge chamber wall 305 and the opposed dielectric member 202 of the planar emission lamp are in contact with each other so that heat can be suitably conducted therebetween, and so that the vapor pressure of mercury can be controlled without providing the mercury reservoir 204.

Figure 3:
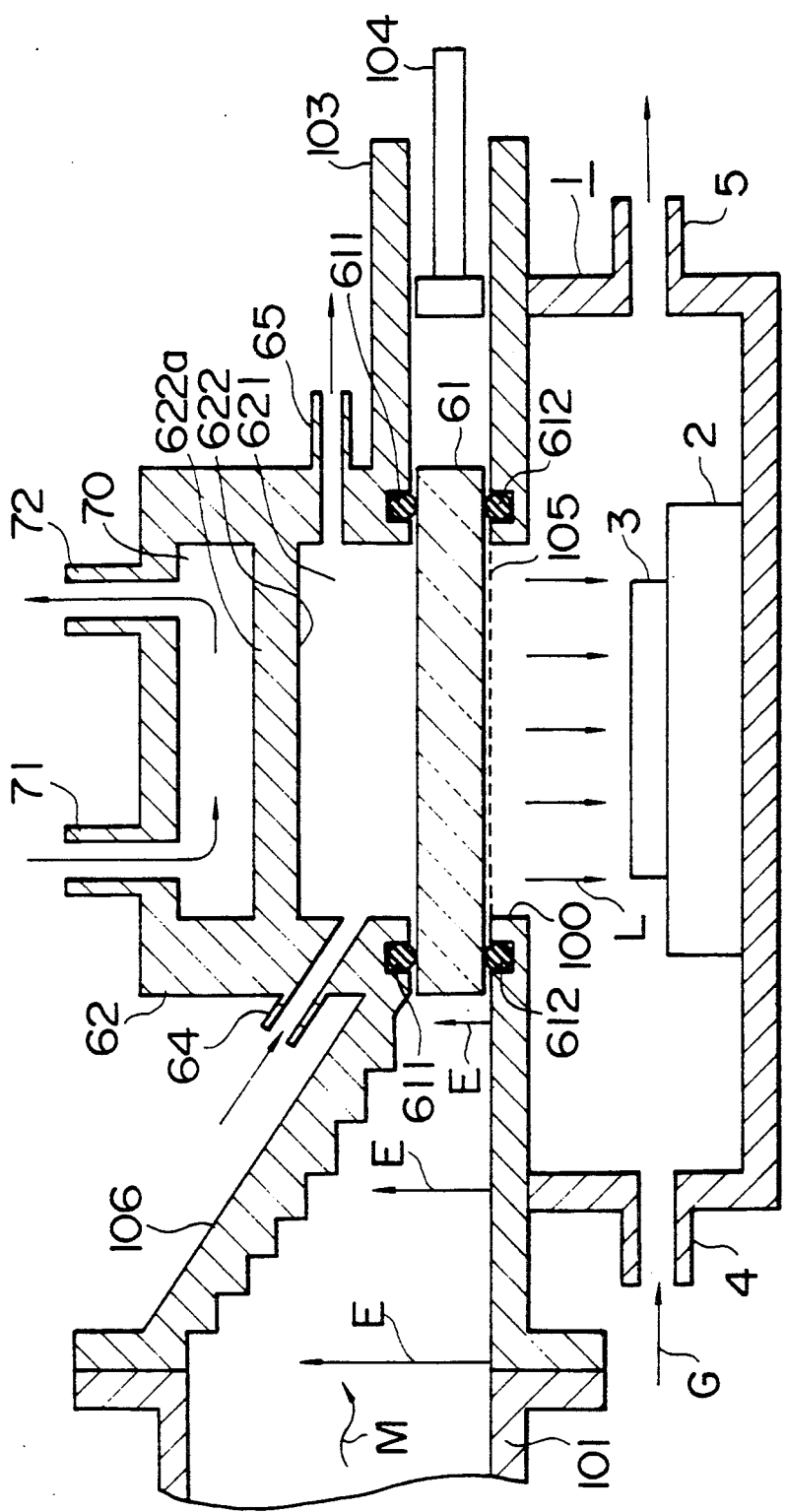
FIG. 3 is a schematic cross-sectional view of a photo-excitation processing apparatus to which a microwave discharge light source device in accordance with a second embodiment of the present invention is applied.

In the third embodiment; the tapered waveguide 102 is used to reduce the waveguide width of the E-plane, but it may be replaced with a stepped waveguide 106 as in the case of the second embodiment shown in FIG. 3.

Figure 6:
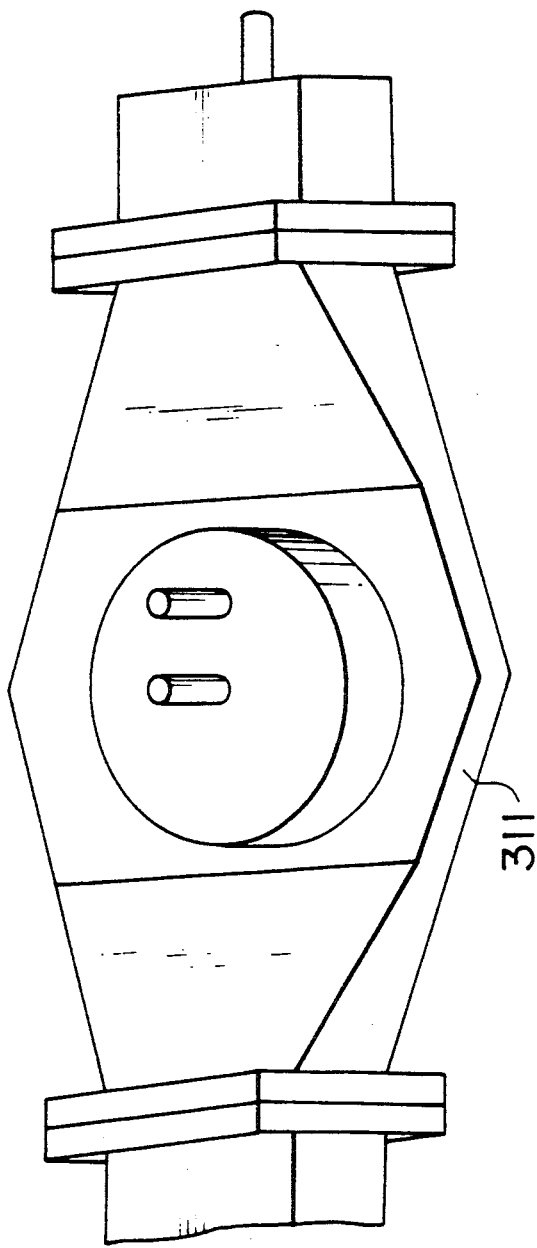
FIG. 6 is a schematic perspective view of a photo-excitation processing apparatus to which a microwave discharge light source device in accordance with a fifth embodiment of the present invention is applied.
Figure 7:
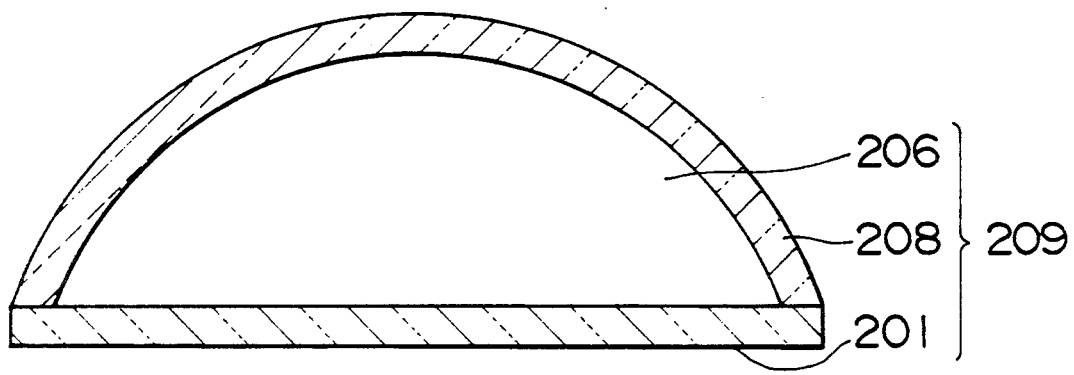
FIG. 7 is a cross-sectional view of another example of the planar emission lamp of the apparatus shown in FIGS. 4 and 5.
Figure 8:
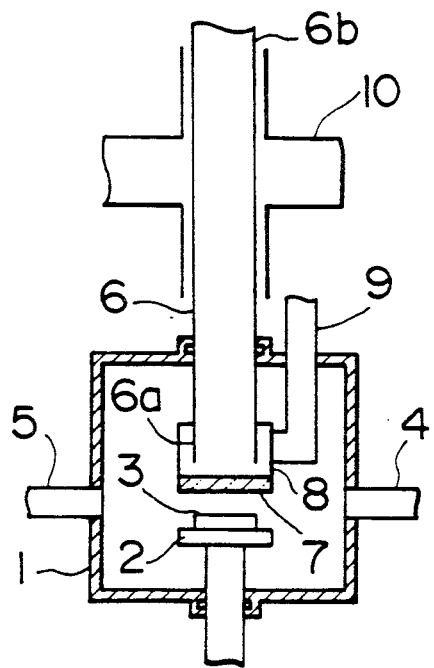
FIG. 8 is a schematic cross-sectional view of a photo-excitation processing apparatus to which a conventional microwave discharge light source device is applied.

To construct a light source having a greater irradiation area, the width of the H-plane of the thin waveguide may be increased in a tapering manner to form a large-diameter discharge chamber 311 in accordance with a fifth embodiment of the present invention shown in FIG. 6.

Also, the planar emission lamp composed of the dielectric plate 201, the side dielectric plate 203 and the opposed dielectric member 202 may be replaced with a planar emission lamp 209 composed of a flat dielectric member 201 and a curved dielectric member 208 to reduce connection portions so that the manufacture facility is improved.

Each of the above-described constructions enables a microwave discharge light source device capable of readily emitting light uniformly form a large-area emission region at a high luminance and capable of extracting light at a high efficiency.

What is claimed is:

1. A microwave discharge light source device comprising:
   a dielectric plate capable of transmitting light and having first and second major surfaces parallel to each other and first and second end surfaces perpendicular to said major surfaces;
   planar emission means having a discharge space having at least one side defined by said dielectric plate and having two major surfaces and two end surfaces generally perpendicular to the major surfaces thereof, said discharge space being filled with a plasma emission medium;
   light-transmitting microwave-reflecting means disposed in a position such as to face said discharge space through said major surfaces of said dielectric plate, said light transmitting microwave-reflecting means being parallel to said major surfaces of both said dielectric plate and said planar emission means said light-transmitting microwave-reflecting means being capable of transmitting light while reflecting microwaves;
   waveguide means for leading a microwave, which has an electric field component in a direction perpendicular to said major surfaces of said dielectric plate, to the first end surface of said dielectric plate, and for introducing the microwave into the dielectric plate through a magnetic wave coupling at this first end surface;
   wherein a microwave electric field is formed in said discharge space so that the plasma emission medium emits light by an electric discharge, the light thus emitted being extracted through said major surfaces of said dielectric plate and said light-transmitting micro-wave reflecting means.

2. A microwave discharge light source device according to claim 1 further comprising cooling means for cooling said discharge space from the outside of said planar emission means.

3. A microwave discharge light source device according to claim 1 wherein said waveguide means includes a waveguide tapered toward the first end surface of said dielectric plate at the microwave incidence side with respect to an E-plane, and a thin waveguide extending from the second end surface of said dielectric plate and having a movable terminal end;
   wherein said discharge space of said planar emission means has one side formed by said first major surface of said dielectric plate serving as a light transmission window, and which is formed integrally with said waveguides;
   wherein said dielectric plate is fixed at its first and second ends to said waveguide in an airtight manner so that said discharge space, interiors of said waveguides and the outside of the device are separated from each other in an airtight manner; and
   wherein said light-transmitting microwave-reflecting means comprises a flat metallic meshwork disposed in the vicinity of the dielectric plate so as to extend along the second major surface of said dielectric plate.

4. A microwave discharge light source device according to claim 3 wherein said planar emission means has an inlet and an outlet for introducing and discharging a plasma emission medium.

5. A microwave discharge light source device according to claim 3 wherein a plasma emission medium is sealed in said discharge space.

6. A microwave discharge light source device according to claim 4 further comprising a cooling means for cooling said discharge space, said cooling means having a cooling bath formed in said planar emission means by being separated from said discharge space by a partition plate formed of a material having a high heat conductivity, said cooling bath having a cooling liquid supply port and a cooling liquid discharge port.

7. A microwave discharge light source device according to claim 6 wherein said tapered waveguide of said waveguide means is a tapered waveguide having a tapered inner wall surface.

8. A microwave discharge light source device according to claim 6 wherein said tapered waveguide of said waveguide means is a tapered waveguide having a stepped inner wall to be generally tapered.

9. A microwave discharge light source device according to claim 6 wherein a surface of said partition plate facing said dielectric plate is formed as a light reflecting surface, light traveling to said reflecting surface being reflected to the dielectric plate by said light reflecting surface.

10. A microwave discharge light source device according to claim 6 wherein a width in a direction of an H-plane of said waveguide is tapered toward the first end surface of said dielectric plate at the microwave incidence side with respect to the E-plane and said thin wave-guide included in said waveguide means is gradually increased with respect to a direction of said dielectric plate so that the area of said discharge space of said planar emission means and said light-transmitting microwave reflecting means is increased in the direction of the H-plane.

11. A microwave discharge light source device according to claim 1 wherein said planar emission means includes a planar emission lamp having one face formed by said first major surface of said dielectric plate serving as a light transmission window and having its other faces formed by another dielectric member respectively, said discharge space being formed in said planar emission means, said plasma emission medium being sealed in said planar emission lamp;
wherein said planar emission means has an irradiation opening formed outside of said dielectric plate;
wherein said waveguide means is formed integrally with said planar emission means, said waveguide means including a waveguide tapered toward the first end surface of said dielectric plate at the microwave incidence side with respect to an E plane, and a thin waveguide extending from the second end surface of said dielectric plate and having a movable terminal end;
wherein said planar emission lamp is fixed to said planar emission means and said waveguides so that interiors of said waveguides and the outside of the device are separated from each other in an airtight manner; and
wherein said light-transmitting microwave-reflecting means comprises a flat metallic meshwork disposed in the vicinity of the dielectric plate so as to extend along the second major surface of said dielectric plate.

12. A microwave discharge light source device according to claim 11 further comprising a cooling means for cooling said discharge space said cooling means having a cooling bath formed in said planar emission means by being separated from said planar emission lamp by a partition plate formed of a material having a high heat conductivity, said cooling bath having a cooling liquid supply port and a cooling liquid discharge port.

13. A microwave discharge light source device according to claim 12 wherein said partition plate separating said cooling bath and said planar emission lamp has an opening, said planar emission lamp has a mercury reservoir projecting in said cooling bath through said opening of said partition plate and fixed to said opening in an airtight manner, and said cooling liquid supply port of said cooling bath is formed in a position such that the cooling liquid efficiently strikes against the said mercury reservoir.

14. A microwave discharge light source device according to claim 12 wherein said tapered waveguide of said waveguide means is a tapered waveguide having a tapered inner wall surface.

15. A microwave discharge light source device according to claim 12 wherein said tapered waveguide of said waveguide means is a tapered waveguide having a stepped inner wall to be generally tapered.

16. A microwave discharge light source device according to claim 12 wherein a surface of said partition plate facing said dielectric plate of said planar emission lamp is formed as a light reflecting surface, light traveling to said reflecting surface being reflected to the dielectric plate by said light reflecting surface.

17. A microwave discharge light source device according to claim 12 wherein said planar emission lamp is composed of said dielectric plate and a curved dielectric member fixed to said dielectric plate so that said discharge space is formed therebetween, and that bonded portions are reduced.

18. A microwave discharge light source device according to claim 12 wherein a width in a direction of an H-plane of said waveguide is tapered toward the first end surface of said dielectric plate at the microwave incidence side with respect to the E-plane and said thin wave-guide included in said waveguide means is gradually increased with respect to a direction of said dielectric plate so that the area of said discharge space of said planar emission means and said light-transmitting microwave reflecting means is increased in the direction of the H-plane.

19. A microwave discharge light source device according to claim 1 wherein said microwave discharge light source device is used as a discharge light source for a photo-excitation processing apparatus in which an object to be processed while being placed in a reaction chamber filled with a reactant gas is irradiated with the light extracted through said light-transmitting microwave reflecting means so that the object to be processed undergoes photo-excitation processing based on the photochemical reaction of the light and the reactant gas.

* * * * *